United States Patent
Shen et al.

(10) Patent No.: US 10,545,533 B1
(45) Date of Patent: Jan. 28, 2020

(54) MODULAR EXTERNAL FRAME FOR MOBILE COMPUTING DEVICES

(71) Applicant: ZEBRA TECHNOLOGIES CORPORATION, Lincolnshire, IL (US)

(72) Inventors: Mu-Kai Shen, Taipei (TW); Yanmin Mao, Brampton (CA); I-Heng Tsai, Taipei (TW); Huang Chih Huang, Taoyuan (TW); JaeHo Choi, Whitestone, NY (US); Mark X. Lamont, Coram, NY (US); Carl A. Thelemann, East Islip, NY (US); Bo Xu, Mississauga (CA); Xinghua Shi, Milton (CA)

(73) Assignee: Zebra Technologies Corporation, Lincolnshire, IL (US)

( * ) Notice: Subject to any disclaimer, the term of this patent is extended or adjusted under 35 U.S.C. 154(b) by 0 days.

(21) Appl. No.: 16/297,110

(22) Filed: Mar. 8, 2019

(51) Int. Cl.
*G06F 1/16* (2006.01)
*H05K 5/03* (2006.01)
*H05K 5/02* (2006.01)
*G06K 7/10* (2006.01)

(52) U.S. Cl.
CPC .......... *G06F 1/1626* (2013.01); *G06F 1/1658* (2013.01); *G06F 1/1671* (2013.01); *H05K 5/023* (2013.01); *H05K 5/03* (2013.01); *G06K 7/10881* (2013.01)

(58) Field of Classification Search
CPC .................................................... G06F 1/1626

USPC .............. 361/679.02, 679.3, 679.55, 679.56; 174/66, 67; 235/472.01, 472.02
See application file for complete search history.

(56) References Cited

U.S. PATENT DOCUMENTS

| | | | | |
|---|---|---|---|---|
| 5,410,141 A * | 4/1995 | Koenck | .................. | B60R 11/02 235/472.02 |
| 6,031,524 A * | 2/2000 | Kunert | .................. | G06F 3/0202 345/169 |
| 6,109,528 A * | 8/2000 | Kunert | ............... | G06K 7/10881 235/462.45 |
| 7,023,692 B2 * | 4/2006 | Mansutti | ............... | G06F 1/1626 361/679.56 |
| 7,175,094 B2 * | 2/2007 | Bhatia | ................ | G06K 7/10881 235/472.01 |
| D614,627 S * | 4/2010 | Lerner | ......................... | D14/429 |
| 7,706,140 B2 * | 4/2010 | Grunow | ............... | G06F 1/1626 235/472.01 |
| 8,199,489 B2 * | 6/2012 | Mangaroo | ............. | G06F 1/1626 235/472.01 |
| 8,593,793 B2 * | 11/2013 | Gandhi | ................. | G06F 1/1656 361/679.01 |

(Continued)

*Primary Examiner* — Anthony Q Edwards (57) ABSTRACT

A mobile computing device includes: a device housing including a base, a perimeter wall extending from the base to a perimeter upper edge and having a forward section and a rear section, and a display seat within the forward section of the perimeter wall; a display module including a display assembly supported adjacent to the perimeter upper edge by the display seat, and a display module cover overlaid on the display panel; an external frame member including: (i) a U-shaped wall removably affixed to the forward section of the perimeter wall and terminating at the rear section of the perimeter wall; and (ii) a retaining bezel extending from the U-shaped wall over the perimeter upper edge.

20 Claims, 5 Drawing Sheets

(56) References Cited

U.S. PATENT DOCUMENTS

| | | | |
|---|---|---|---|
| 2009/0091886 A1* | 4/2009 | Grunow | G06F 1/1626 361/679.56 |
| 2010/0025286 A1* | 2/2010 | Mangaroo | G06F 1/1626 206/701 |
| 2010/0073869 A1* | 3/2010 | Mangaroo | G06K 7/0004 361/679.55 |
| 2015/0063795 A1* | 3/2015 | Orton | F16M 11/00 396/425 |
| 2015/0355681 A1* | 12/2015 | Chen | G06F 1/1654 361/679.56 |

* cited by examiner

MODULAR EXTERNAL FRAME FOR MOBILE COMPUTING DEVICES

BACKGROUND

Mobile computing devices typically include display modules that may include display and/or touch screen panels (e.g. glass panels) that are prone to scratching, cracking and other damage. Such devices typically mount the above-mentioned panels within a device housing to protect the panels. However, such a mounting arrangement may increase the size, complexity and cost of the device housing, and may also render servicing of the device more complex and time-consuming.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Examples disclosed herein are directed to a mobile computing device, comprising: a device housing including a base, a perimeter wall extending from the base to a perimeter upper edge and having a forward section and a rear section, and a display seat within the forward section of the perimeter wall; a display module including a display assembly supported adjacent to the perimeter upper edge by the display seat, and a display module cover overlaid on the display panel; an external frame member including: (i) a U-shaped wall removably affixed to the forward section of the perimeter wall and terminating at the rear section of the perimeter wall; and (ii) a retaining bezel extending from the U-shaped wall over the perimeter upper edge.

Additional examples disclosed herein are directed to an external frame member for a mobile computing device, comprising: a U-shaped wall configured to removably affix to a forward section of a perimeter wall of a device housing of the mobile computing device, and terminate at a rear section of the perimeter wall; and a retaining bezel extending from the U-shaped wall, the retaining bezel configured to extend over a perimeter upper edge of the perimeter wall to retain a display module cover of the mobile computing device against the device housing.

Further examples disclosed herein are directed to a method of assembling a mobile computing device, comprising: affixing a display assembly to a display seat defined within a forward section of a perimeter wall of a device housing; placing a display module cover over the display assembly; applying a clamping force the display module cover to the device housing over the display assembly; removably affixing a U-shaped wall of an external frame member to the forward section of the perimeter wall such that a retaining bezel of the external frame member retains the display module cover against the device housing; and removing the clamping force.

Figure 1:
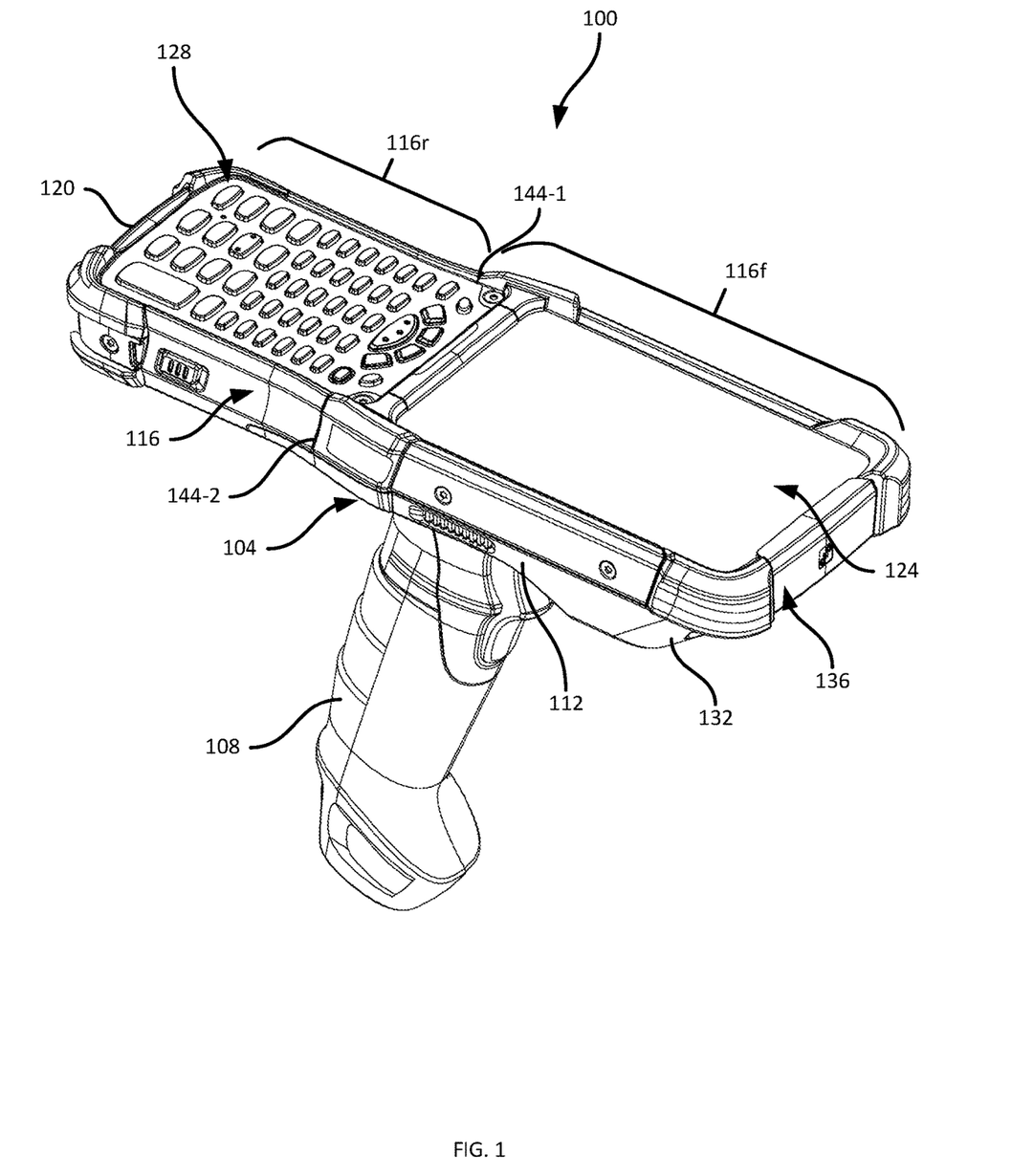
FIG. 1 is an isometric view of a mobile computing device.

FIG. 1 depicts a mobile computing device 100, which may be deployed in a wide variety of environments, including transport and logistics facilities (e.g. warehouses), healthcare facilities, and the like. The mobile device 100 in the example illustrated in FIG. 1. includes a housing including a body portion 104 and a grip portion 108. In the present example the grip 108 is a pistol grip, although in other examples the grip 108 can have various other configurations, or can simply be omitted. The housing body 104, in particular, includes a base 112 from which the grip portion 108 extends. The housing body 104 also includes a perimeter wall 116 extending from the base 112 to a perimeter upper edge 120.

The housing supports various components of the mobile device 100. Certain components, including microcontrollers, communication assemblies, and the like, are contained within the housing (e.g. within the body 104) and are not exposed to the exterior of the mobile device 100. Other components form an operator interface of the mobile device 100, and are therefore at least partially exposed to the exterior of the mobile device. Such interface components include a display module 124 and a keypad module 128. As illustrated in FIG. 1, the display module 124 and the keypad module 128 are supported adjacent to the perimeter upper edge 120 of the housing body 104. The mobile device 100 also includes further components, such as a data capture assembly 132 (e.g. a barcode scanner) mounted on the base 112 of the housing body 104.

The mobile device 100 also includes a modular external frame member 136, also referred to as an exoframe 136. The exoframe 136 is a generally U-shaped member removably mounted to the housing body 104 (specifically, to the perimeter wall 116 in this example). The exoframe 136 encircles a forward section 116*f* of the perimeter wall 116 (which is concealed beneath the exoframe 136 in FIG. 1), and terminates at first and second ends 144-1 and 144-2. When the exoframe 136 is installed, as shown in FIG. 1, the ends 144 of the exoframe 136 are adjacent to a rear section 116*r* of the perimeter wall 116. In other words, the rear section 116*r* of the perimeter wall 116 is not covered or otherwise engaged by the exoframe 136, while the forward section 116*f* is at least partially covered by the exoframe 136, when the exoframe 136 is installed.

As will be discussed in greater detail below, the exoframe 136 is removably affixed to the perimeter wall 116, and is configured to retain the display assembly 124 against the housing body 104 and/or protect the display assembly 124 from shocks, scratches and the like. The exoframe 136 may also provide a degree of environmental protection (e.g. against ingress of fluid, dust and the like, and against shocks, drops and the like) to the display assembly 124 and underlying components.

Figure 2:
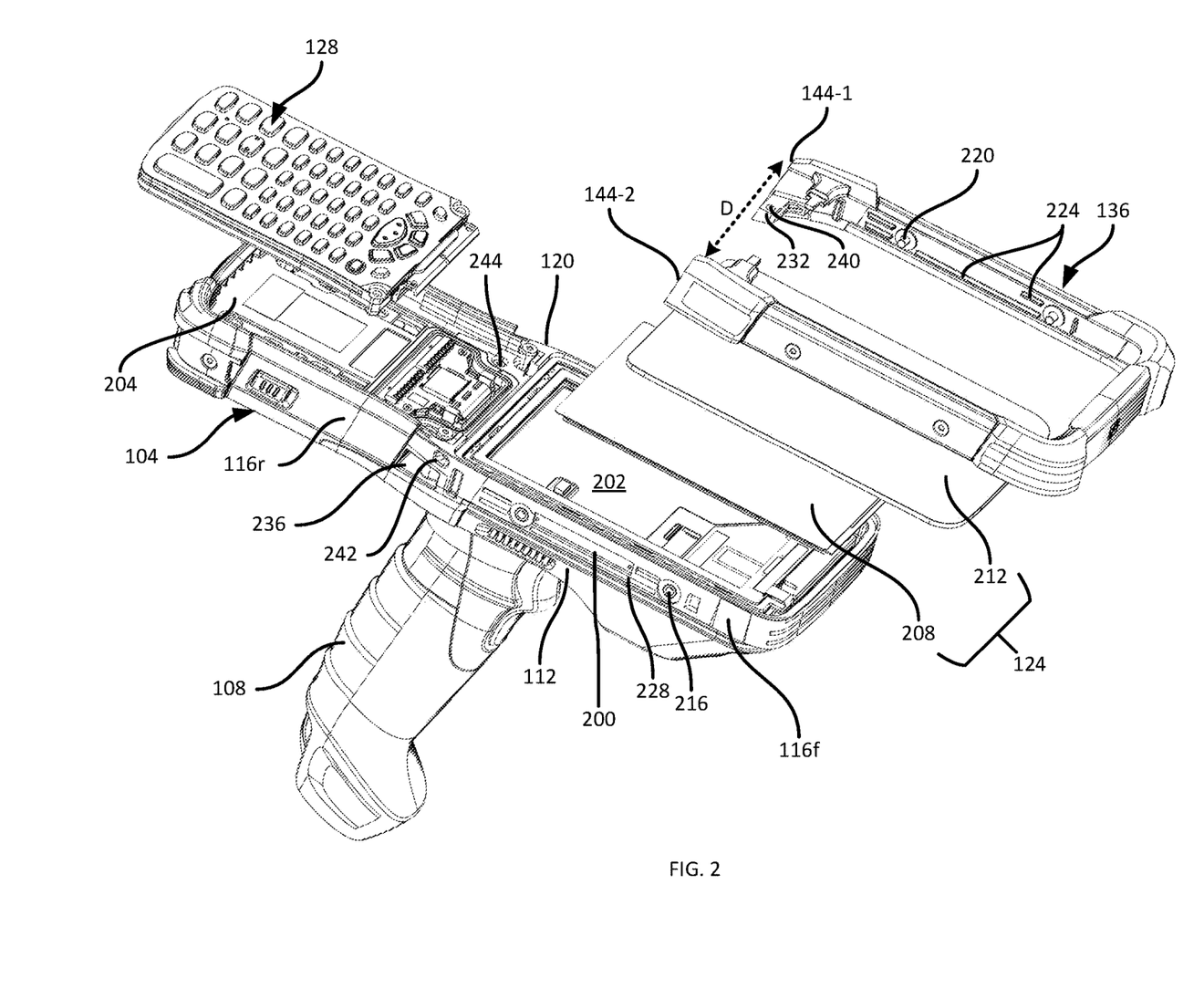
FIG. 2 is a partially exploded view of the mobile computing device of FIG. 1.

Turning to FIG. 2, a partially exploded view of the mobile device 100 is shown, revealing the forward section 116f of the perimeter wall 116. In the present example, the forward section 116f of the perimeter wall 116 supports a reflector strip 200 configured to enhance the performance of an antenna contained within the housing body 104.

Also illustrated in FIG. 2 are a display seat 202 and a keypad seat 204, each defined by the housing body 104 and/or mounting components within the housing body 104. The keypad seat 204 is configured to receive and support the keypad module 128, while the display seat 202 is configured to receive and support at least a portion of the display module 124 adjacent to the perimeter upper edge 120. As shown in FIGS. 1 and 2, the forward section 116f and the rear section 116r of the perimeter wall 116 generally correspond to the locations of the display module 124 and the keypad module 128. That is, the keypad seat 204 is generally located within the rear section 116r, and the display seat 202 is generally located within the forward section 116f. The forward section 116f can, however, extend beyond the rear end of the display module 124 (and therefore the display seat 202), as is the case in the illustrated embodiment.

The display module 124, as illustrated in FIG. 2, includes a display assembly 208 and a display module cover 212. The display assembly 208 includes, in the present example, a plurality of layers, such as one or more layers for implementing a liquid crystal display (LCD) or other suitable display technology. The display assembly 208 is supported adjacent to the perimeter upper edge 120 by the display seat 202, and can be affixed to the display seat 202 by adhesives, press-fitting, or suitable fasteners.

The display assembly 208 is overlaid with the display module cover 212. The cover 212 includes, in the present example, a panel of translucent or transparent material (e.g. glass). The cover 212 can also include touch sensing or display circuitry in some examples. The cover 212 can be affixed to the display assembly 208, e.g. via adhesives.

The forward section 116f of the perimeter wall 116 includes apertures 216 (four in the present example, two on each side of the forward section 116f; other numbers of apertures 216 may be provided in other examples). The apertures 216 are configured to receive fasteners 220 that extend through corresponding openings in the exoframe 136, to affix the exoframe to the perimeter wall 116. Other fastening mechanisms are also contemplated for affixing the exoframe 136 to the perimeter wall 116, include latching mechanisms and the like. The exoframe 136 can include ridges 224 on an inner surface thereof, configured to engage with corresponding channels 228 defined in the forward section 116f of the perimeter wall 116 to correctly locate the exoframe 136 for assembly to the perimeter wall 116.

In the present example, the exoframe 136 also includes additional fastening structures for affixing the exoframe 136 to the housing body 104. In particular, the exoframe 136 includes a tab 232 at each end 144 that is configured for insertion into a corresponding socket 236 on each side of the forward section 116f of the perimeter wall 116. The tabs 232 include openings 240 therethrough for receiving fasteners such as bolts, screws or the like inserted into corresponding openings 244 of the housing body 104. Further, the exoframe 136 is resiliently deformable to permit a distance "D" between the ends 144 to be increased, permitting the tabs 232 to be pulled apart for insertion into the sockets 236, following which the exoframe 136 returns to the resting configuration as illustrated. As also shown in FIG. 2, the housing body 104 defines a pit 242 on either side thereof, configured to receive a complementary portion of the exoframe 136 to be discussed below. Additional structural features of the exoframe 136 will be discussed in greater detail below in connection with FIGS. 3A and 3B.

Figure 3A:
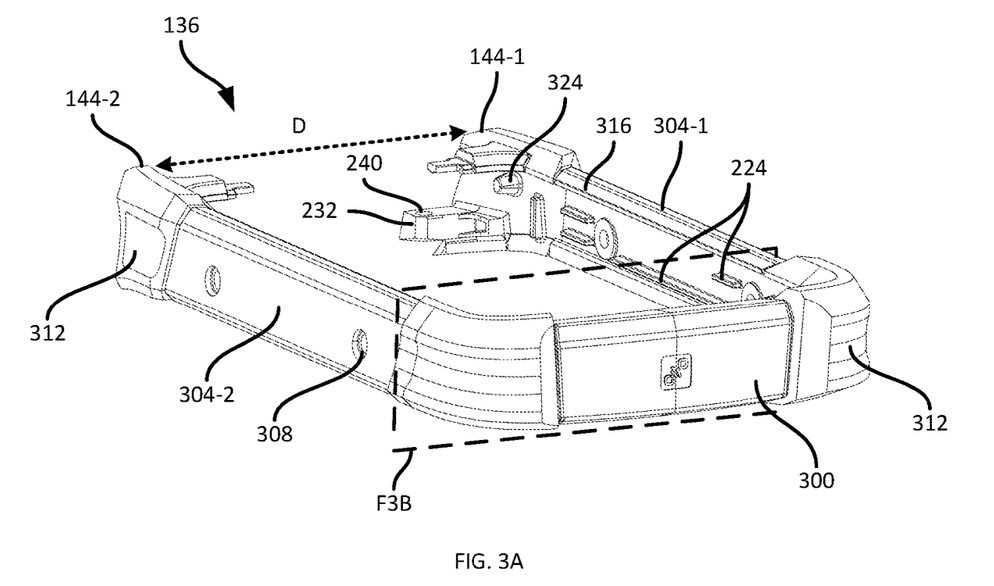
FIG. 3A is an isometric view of an external frame member of the mobile computing device of FIG. 1 in isolation.

Referring to FIG. 3A, the exoframe 136 is shown in isolation. As noted earlier, the exoframe 136 is generally U-shaped, and includes a forward segment 300 with a pair of side segments 304-1, 304-2 extending from opposing ends of the forward segment 300. The ridges 224 are defined on inner surfaces of the side segments 304, as well as on the inner surface of the forward segment 300. In other examples, however, some or all of the ridges 224 can be omitted. As mentioned above, the exoframe 136 includes openings 308 through the side segments 304 for receiving the fasteners 220.

The exoframe 136 also includes, in the present example, a plurality of shock-absorbing bumpers 312. In particular, in the illustrated example the exoframe 136 includes a bumper 312 at each end 144, and a bumper 312 at each corner of the U shape (that is, where the side segments 304 join with the forward segment 300). The segments 300 and 304 can be fabricated as a single piece of material (e.g. via injection molding or the like), and the bumpers 312 can be overmolded onto the segments 300 and 304. The bumpers 312 can be formed from a material distinct from the material of the segments 300 and 304 (e.g. rubber or the like). Various other mechanisms can be employed for joining the bumpers 312 with the segments 300 and 304, however, including suitable adhesives.

The flexibility of the exoframe 136 mentioned above, which permits the exoframe 136 to be resiliently deformed for installation, can be enabled by the materials from which the segments 300 and 304 and/or the bumpers 312 are fabricated. For example, the segments 300 and 304 can be formed from a resilient plastic that permits that above-noted deformation. In some embodiments, the wall thickness of the segments 300 and 304 can be reduced at the corners (i.e. where the segments 304 join with the segment 300). In other examples, the corners of the exoframe 136 can be defined entirely by the bumpers. That is, the segments 300 and 304 can be physically distinct, with the bumpers 312 acting to join the segments as well as to provide the above-mentioned flexibility.

Figure 3B:
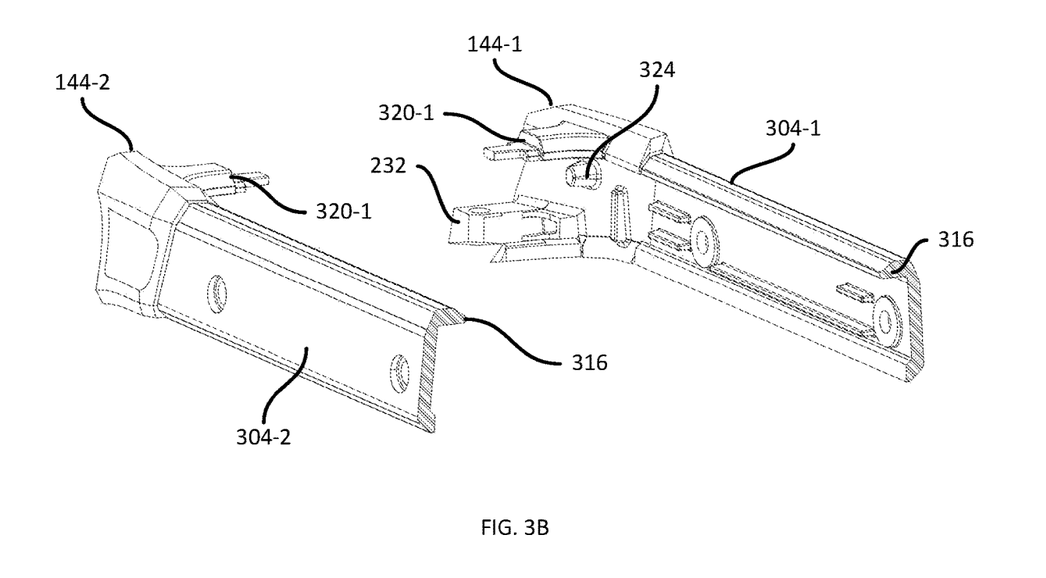
FIG. 3B is a cross-sectional view of the external frame member of FIG. 3A.

The exoframe 136 also includes a retaining bezel 316 extending from the U-shaped wall defined by the segments 300 and 304 towards the interior to the "U". The bezel 316, in the present example, extends continuously around the U from the upper edges of the segments 300 and 304. FIG. 3B illustrates a cross section of the exoframe 136, taken at the plane F3B shown in FIG. 3A.

As shown in FIG. 3B, the retaining bezel 316 is substantially perpendicular to the segments 304, and is therefore substantially parallel to the display module cover 212 when the exoframe 136 is installed on the mobile device 100. As also seen in FIG. 3B, the exoframe 136 can include bezel extensions 320-1 and 320-2 extending inwards from adjacent to the ends 144. The bezel extensions 320 are configured to extend over a rear edge of the display module cover 212. In other examples, the extensions 320 can be omitted.

The exoframe 136 also includes a pin 324 extending inwardly from each of the segments 304-1 and 304-2 adjacent to the ends 144. The pins 324, when the exoframe 136 is installed on the housing body 104, extend into the pits 242, one of which is shown in FIG. 2. The pins 324, by engaging with the pits 242, resist deformation of the exoframe near the ends 144 that can result in peeling of the ends 144 away from the housing body 104 during use of the device 100.

Figure 4:
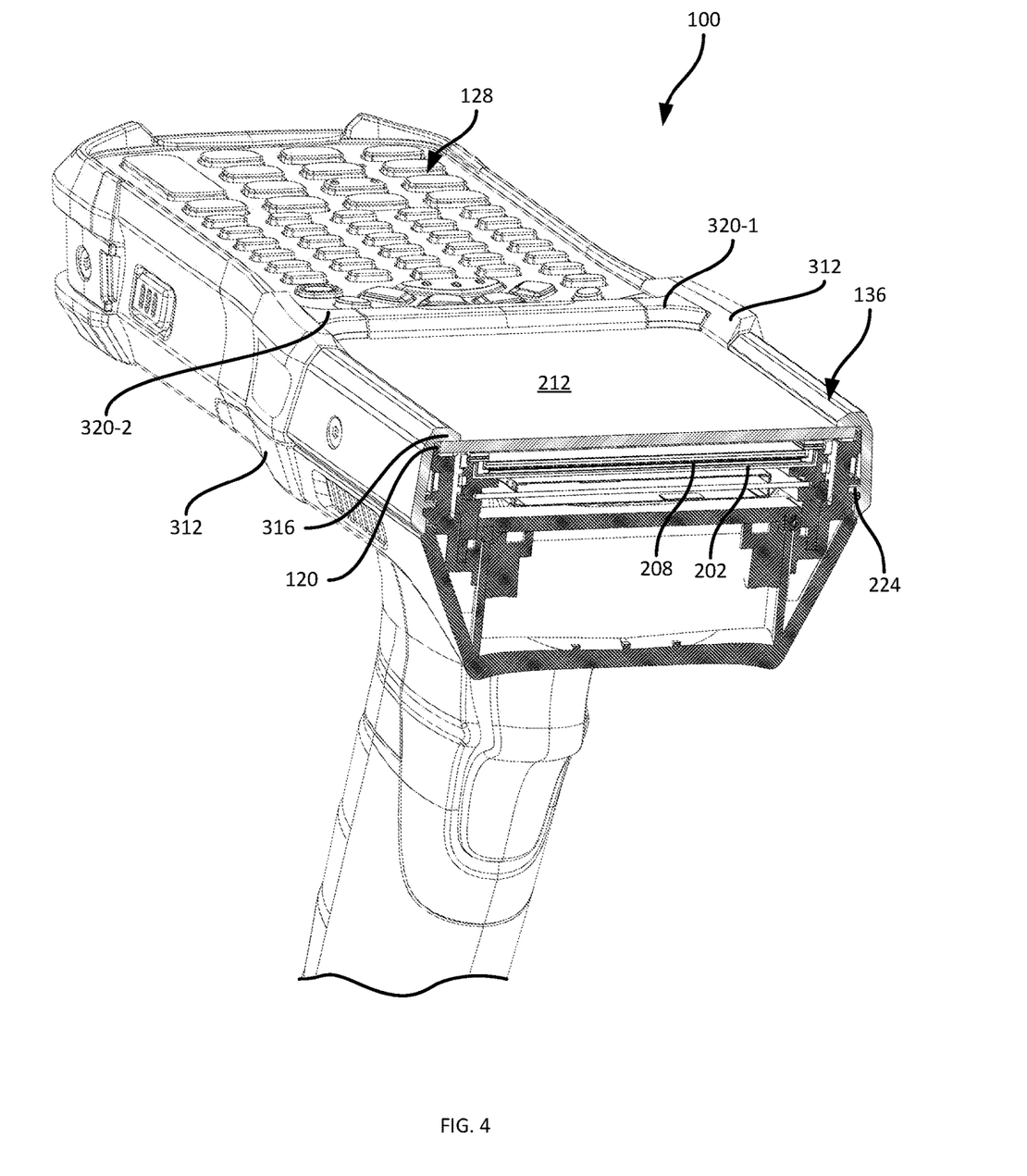
FIG. 4 is a cross-sectional view of the mobile computing device of FIG. 1.

Turning now to FIG. 4, a cross section of the mobile device 100 is illustrated with the exoframe 136 in an installed position. As seen in FIG. 4, the retaining bezel 316 extends from the U-shaped wall defined by the segments 300 and 304 over the perimeter upper edge 120 of the perimeter wall 116 to cover a perimeter of the display module cover 212. As a result, the exoframe 136 surrounds the cover 212 and provides physical protection to the cover 212. The exoframe 136 also permits removal of the cover 212, for example for servicing of the cover 212 itself or of the display assembly 208 beneath the cover 212, without requiring the dismantling of the housing body 104 itself. Instead, removal of the cover 212 requires only removal of the exoframe 136, which releases the cover 212.

As also shown in FIG. 4, the exoframe 136 and the bumpers 312 extend above the surface of the cover 212, and therefore reduces the likelihood of damage to the cover 212 when the device 100 is dropped on the side of the cover 212 (as the bumpers 312 and/or exoframe 136 impact the ground, rather than the cover 212). The exoframe 136 can also provide additional rigidity to the housing base 104 to resist deformation in the event of a drop, shock or the like, further mitigating the impact of such events on the cover 212 and other components of the device 100.

Figure 5:
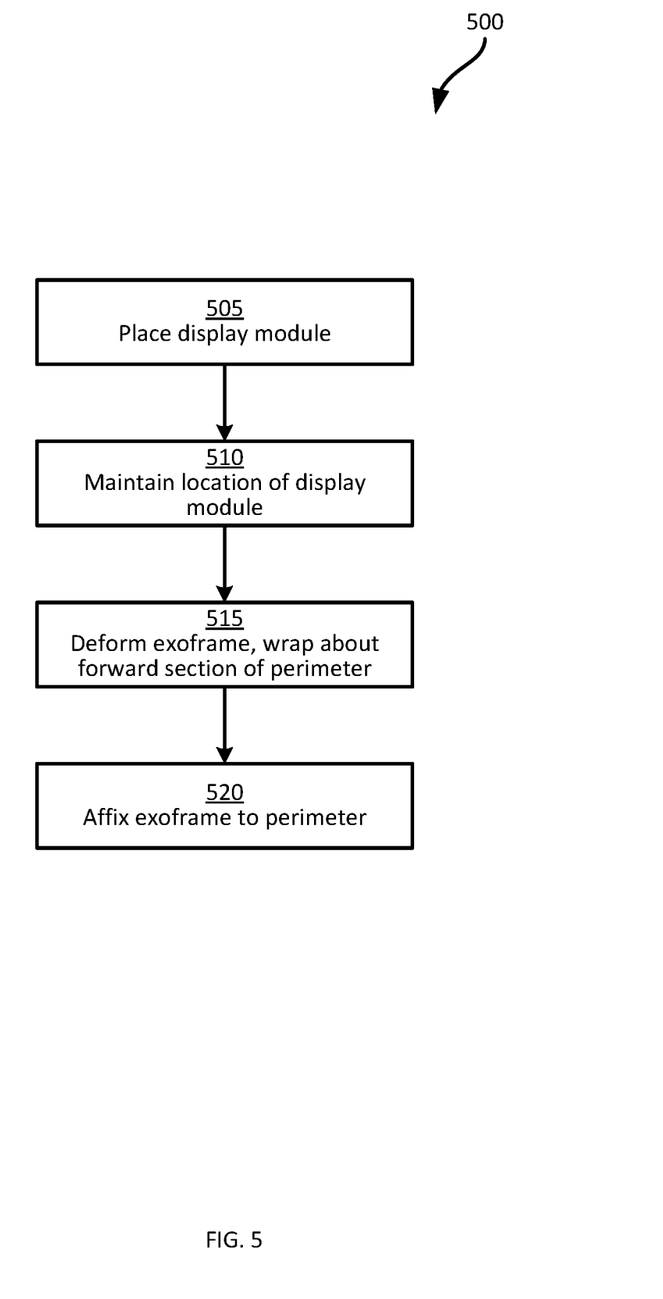
FIG. 5 is a flowchart of a method for assembling the external frame member of FIG. 3A to the mobile computing device of FIG. 1.

As will now be apparent from the discussion above, methods of assembling and disassembling the exoframe 136 to and from the remainder of the device 100 during device manufacture and maintenance are contemplated. FIG. 5 illustrates an example method of assembling the display module 124 and the exoframe 136 to the device 100. At block 505, the display module 124 is placed into the housing body 104. At block 510, the location of the display module 124 is maintained until the exoframe 136 is placed, for example by applying a suitable jig or other locating mechanism.

At block 515, the exoframe 136 is deformed (e.g. manually by the operator performing the assembly) to pull the ends 144 apart. The exoframe 136 is then placed so as to engage the tabs 232 into the sockets 236, and the ridges 224 into the corresponding channels 228 on the perimeter wall 116. At block 520, the exoframe 136 is affixed to the perimeter wall, e.g. via insertion of the fasteners 220. Fasteners may also be applied to the tabs 232 and sockets 236 at block 525.

Following affixing of the exoframe 136 at block 520, the above-mentioned jig or other locationing mechanism, if employed at block 510, is removed. As will be apparent to those skilled in the art, disassembling the exoframe 136 from the device 100 may be performed by reversing the performance of the method 500. Following disassembly, the exoframe may be replaced, the display module 124 may be serviced, and removal of the display module 124 may also permit access to other internal components of the device 100.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A mobile computing device, comprising:
   a device housing including a base, a perimeter wall extending from the base to a perimeter upper edge and having a forward section and a rear section, and a display seat within the forward section of the perimeter wall;
   a display module including a display assembly supported adjacent to the perimeter upper edge by the display seat, and a display module cover overlaid on the display assembly;
   an external frame member including:
      (i) a U-shaped wall removably affixed to the forward section of the perimeter wall and terminating at the rear section of the perimeter wall; and
      (ii) a retaining bezel extending from the U-shaped wall over the perimeter upper edge of the display module cover.

2. The mobile computing device of claim 1, further comprising:
   a keypad seat within the rear section of the perimeter wall adjacent to the forward section; and
   a keypad module supported adjacent to the perimeter upper edge by the keypad seat.

3. The mobile computing device of claim 1, wherein the external frame member comprises:
   a forward segment having opposing ends defining corners of the U-shaped wall; and
   a pair of side segments each extending from the corners to respective terminating ends.

4. The mobile computing device of claim 3, wherein the external frame member further comprises a shock-absorbing bumper at each of the corners.

5. The mobile computing device of claim 3, wherein the external frame member further comprises an additional shock-absorbing bumper at each of the terminating ends.

6. The mobile computing device of claim 4, wherein the segments include a first material, and the bumpers include a second material.

7. The mobile computing device of claim 3, wherein the corners are resiliently deformable to increase a distance between the terminating ends.

8. The mobile computing device of claim 1, wherein the external frame member includes an aperture for receiving a fastener therethrough to engage with the perimeter wall.

9. The mobile computing device of claim 1, wherein the external frame member includes a ridge on an inner surface thereof, configured to engage with a corresponding channel on the forward section of the perimeter wall.

10. An external frame member for a mobile computing device, comprising:
    a U-shaped wall configured to removably affix to a forward section of a perimeter wall of a device housing of the mobile computing device, and terminate at a rear section of the perimeter wall; and
    a retaining bezel extending from the U-shaped wall, the retaining bezel configured to extend over a perimeter upper edge of the perimeter wall to retain a display module cover of the mobile computing device against the device housing.

11. The external frame member of claim 10, further comprising:
    a forward segment having opposing ends defining corners of the U-shaped wall; and
    a pair of side segments each extending from the corners to respective terminating ends.

12. The external frame member of claim 11, further comprising:
    a tab at each terminating end, configured to extend into a corresponding socket on the perimeter wall of the device housing.

13. The external frame member of claim 11, further comprising a shock-absorbing bumper at each of the corners.

14. The external frame member of claim 11, further comprising an additional shock-absorbing bumper at each of the terminating ends.

15. The external frame member of claim 13, wherein the segments include a first material, and the bumpers include a second material.

16. The external frame member of claim 11, wherein the corners are resiliently deformable to increase a distance between the terminating ends.

17. The external frame member of claim 10, further comprising an aperture for receiving a fastener therethrough to engage with the perimeter wall.

18. The external frame member of claim 10, further comprising a ridge on an inner surface thereof, configured to engage with a corresponding channel on the forward section of the perimeter wall.

19. The external frame member of claim 10, further comprising:
    a retaining bezel extension extending from each of the side segments adjacent to the terminating ends.

20. A method of assembling a mobile computing device, comprising:
    affixing a display assembly to a display seat defined within a forward section of a perimeter wall of a device housing;
    placing a display module cover over the display assembly; and
    removably affixing a U-shaped wall of an external frame member to the forward section of the perimeter wall such that a retaining bezel of the external frame member retains the display module cover against the device housing.

* * * * *